United States Patent [19]
Barr et al.

[11] Patent Number: 5,939,238
[45] Date of Patent: Aug. 17, 1999

[54] PHOTOIMAGEABLE COMPOSITION HAVING IMPROVED PHOTOINITIATOR SYSTEM

[75] Inventors: Robert Barr, Laguna Niguel; Daniel E. Lundy, Pomona, both of Calif.; Eiji Kosaka; Shigeru Murakami, both of Gifu Prefecture, Japan

[73] Assignee: Morton International, Inc., Chicago, Ill.

[21] Appl. No.: 09/088,561

[22] Filed: Jun. 2, 1998

[51] Int. Cl.$^6$ ........................................................ G03C 5/00
[52] U.S. Cl. ........................ 430/281.1; 430/916; 430/917
[58] Field of Search ................................. 430/281.1, 916, 430/917

[56] References Cited

U.S. PATENT DOCUMENTS

| | | | |
|---|---|---|---|
| 3,953,309 | 4/1976 | Gilano et al. | 204/159.16 |
| 4,003,877 | 1/1977 | Lipson et al. | 260/47 UA |
| 4,245,030 | 1/1981 | Faust et al. | 430/281 |
| 4,414,312 | 11/1983 | Goff et al. | 430/283 |
| 4,499,163 | 2/1985 | Ishimaru et al. | 430/5 |
| 4,610,951 | 9/1986 | Lipson et al. | 430/313 |
| 4,695,527 | 9/1987 | Geissler et al. | 430/256 |
| 5,217,845 | 6/1993 | Steppan | 430/281 |
| 5,284,735 | 2/1994 | Okamoto | 430/280 |

FOREIGN PATENT DOCUMENTS 0738927   4/1996   European Pat. Off. .

*Primary Examiner*—Janet Baxter
*Assistant Examiner*—Rosemary Ashton
*Attorney, Agent, or Firm*—Wayne E. Nacker; Gerald K. White

[57] ABSTRACT

The invention provides a negative-acting photoimageable composition comprising A) between about 30 and about 80 wt % based on total weight of A) plus B) of a binder polymer having acid functionality sufficient to render said photoimageable composition developable in alkaline aqueous solution, B) between about 20 and about 70 wt % based on total weight of A) plus B) of an addition-polymerizeable, non-gaseous $\alpha,\beta$-ethylenically unsaturated compound(s) capable of forming a high polymer by free-radical initiated chain-propagating addition polymerization, at least about 50 mole percent of the $\alpha,\beta$-ethylenically unsaturated moieties of B) being methacrylic moieties, and C) between about 0.1 and about 20 wt % based on total weight of A) plus B) of a photoinitiator chemical system, the photoinitiator chemical system comprising between about 0.005 and about 3 wt % relative to total weight of A) plus B) of triphenyphosphine and between about 0.005 and about 2 wt % relative to total weight of A) plus B) of n-phenylglycine.

3 Claims, No Drawings

5,939,238

PHOTOIMAGEABLE COMPOSITION HAVING IMPROVED PHOTOINITIATOR SYSTEM

The present invention is directed to negative-acting photoimageable compositions such as those used as photoresists in the art of printed circuitry. The photoimageable composition has a photoinitiator chemical system which comprises a combination of n-phenylglycine and triphenylphosphine for high photospeed and other performance characteristics.

BACKGROUND OF THE INVENTION

This invention is directed to negative-acting photoimageable compositions which are developable in alkaline aqueous solutions. The invention is particularly applicable to primary photoimaging resists, but is applicable, as well, to compositions that are hardenable so as to form solder masks and the like.

A variety of such photoimageable compositions are described. Essential compositions of the type to which the present invention is directed are A) a binder polymer; B) photopolymerizable $\alpha,\beta$-ethylenically unsaturated compound(s), and C) a photoinitiator chemical system. The binder polymer A) has sufficient acid functionality, generally carboxylic acid functionality, that the binder polymer is soluble in alkaline aqueous solution and thereby renders the photoimageable composition developable in alkaline aqueous solutions. The photopolymerizeable compound(s) B) are monomers and/or short chain oligomers, a substantial portion of which have multiple $\alpha,\beta$-ethylenic unsaturated functionality.

The photoinitiator chemical system C) includes chemicals which generate free radicals upon exposure to actinic radiation. These free radicals propagate the polymerization of the $\alpha,\beta$-ethylenic unsaturated moieties of the photopolymerizeable compounds B). Herein, the photoinitiator system C) is deemed to include not only chemical compounds which generate free radicals, but catalysts or sensitizers which promote the free-radical initiated polymerization of the $\alpha,\beta$-ethylenic unsaturated moieties of the photopolymerizeable compounds B).

It was found that when a substantial proportion of the $\alpha,\beta$-ethylenically unsaturated moieties of the photopolymerizeable compounds B) are methacrylic moieties, i.e., at least about 50 mole percent of the $\alpha,\beta$-ethylenic unsaturated moieties of the photopolymerizeable compounds B), that surprisingly high photospeeds were achieved when the photoinitiator system C) included triphenylphosphine at between about 0.005 and about 3 wt % relative to the total weight of A) plus B). While this increase in photospeed is considered highly desirable, other performance characteristics were adversely affected by the addition of triphenylphosphine, including the long-term stability of the system which reduced the useful life of the product and minimized its usefulness.

Also, this type of photoimageable composition typically uses a color former to produce an intense color after exposure. Such a color former produces a contrast between the exposed and unexposed portions of the photoresist. This serves the practical purpose of letting the operator know the resist has been exposed. In addition a recent industry requirement is to try to inspect a panel for obvious defects, such as dirt on the phototool, before any additional processing takes place, so as to avoid the associated costs of material and time of further processing a defective item. Triphenylphosphine, while promoting photospeed, tended to inhibit color formation, thereby reducing contrast and making it more difficult to inspect exposed photoresist layers.

Other properties adversely affected by triphenylphosphine were adhesion (particularly to the copper of a printed circuit board blank) and tenting strength over through-holes.

Accordingly, an investigation was conducted to find a substitute component of the photoinitiator system which would provide high photospeed, yet avoid some of the disadvantages of triphenylphosphine.

Among materials tried as a substitute for triphenylphosphine was n-phenylglycine. N-phenylglycine also provided good photospeed. However, tent strengths were severely reduced and fine line adhesion was very poor. Any reduction in fine line adhesion and tent strength is directly proportional to an increase in circuit board defects.

SUMMARY OF THE INVENTION

The present invention is directed to a negative-acting photoimageable composition comprises A) an organic polymeric binder having sufficient acid functionality to render the photoimageable composition developable in alkaline aqueous solution, B) an addition-polymerizeable, non-gaseous $\alpha,\beta$-ethylenically unsaturated compound(s) capable of forming a polymer by free-radical initiated chain-propagating addition polymerization, at least about 50 mole percent of the $\alpha,\beta$-ethylenic unsaturation of B) being derived from methacrylic acid functionality, and C)between about 0.1 and about 20 wt % based on total weight of A) plus B) of an organic, radiation-sensitive free-radical generating chemical system activatable by actinic radiation to initiate chain-propagating addition polymerization of the addition-polymerizeable material. In accordance with the invention, the free radical chemical system C) comprises between about 0.005 and about 3 wt % of triphenylphosphine based on total weight of A) plus B) and between about 0.005 and about 2 wt % of n-phenyl glycine based on total weight of A) plus B).

DETAILED DESCRIPTION OF CERTAIN PREFERRED EMBODIMENTS

Herein, unless otherwise noted, all percentages are weight percentages. Component A) (the binder polymer) and Component B) (the photoimageable compounds(s)) which are herein considered to equal 100 wt %, and other components, including the components of the photoinitiator chemical system, being based on total weight of A) plus B).

The invention is directed to photoimageable compositions which are developable in alkaline aqueous solution and which therefore have substantial acid functionality. Such photoimageable compositions typically have a binder A) having acid functionality, typically an acid number of at least about 80, preferably at least about 100 and more preferably about 150 or more, up to about 250. The acid functionality is typically carboxylic acid functionality, but may also include, for example, sulfonic acid functionality or phosphoric acid functionality. Binder polymers for photoimageable compositions typically have weight average molecular weights between about 20,000 and about 200,000, preferably at least about 80,000.

The polymers are typically derived from a mixture of acid functional monomers and non-acid functional monomers. Some specific examples of suitable acid functional monomers are acrylic acid, methacrylic acid, maleic acid, fumaric acid, citraconic acid, 2-acrylamido-2-methylpro- panesulfonic acid, 2-hydroxyethyl acrylolyl phosphate, 2-hydroxypropyl acrylol phosphate, 2-hydroxy-alpha-acryloyl phosphate, etc. One or more of such acid functional monomers may be used to form the binder polymer.

The acid functional monomers may be copolymerized with non-acid functional monomers, such as esters of acrylic acid and methacrylic acid, for example, methyl acrylate, 2-ethyl hexyl acrylate, n-butyl acrylate, n-hexyl acrylate, methyl methacrylate, hydroxy ethyl acrylate, butyl methacrylate, octyl acrylate, 2-ethoxy ethyl methacrylate, t-butyl acrylate, 1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylol propane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, and 1,4-benzenediol dimethacrylate; styrene and substituted styrene, such as 2-methyl styrene and vinyl toluene and vinyl esters, such as vinyl acrylate and vinyl methacrylate to provide the desired acid number.

The amount of the binder polymer A) may vary over a wide range, typically comprising between about 30 to about 80 wt % of the composition based on total weight of A) plus B).

Examples of such polymers and photoimageable compositions using such polymers are found, in the following U.S. Pat. Nos: 3,953,309, 4,003,877, 4,610,951, and 4,695,527 the teaching of each of which are incorporated herein by reference.

The photopolymerizeable component B) is typically a monomer, dimer or short chain oligomer having ethylenic unsaturation, particularly, α,β-ethylenic unsaturation, including monofunctional compounds and compounds having α,β-ethylenic unsaturation functionality 2 or greater. Typically, a mixture of mono-functional and multi-functional monomers will be used. Suitable photopolymerizeable compounds include, but are not limited to, the monomers recited above as suitable for forming binder polymers, particularly the non-acid functional compounds. The amount of photopolymerizeable component B) is typically between about 20 and about 70 wt % of the photoimageable composition based on total weight of A) plus B).

The photoinitiator chemical system of the present invention is particularly effective with respect to methacrylic acid and/or ester functionality. Hence, the invention is directed to compositions in which at least about 50 mole percent of the α,β-ethylenic unsaturation of the photopolymerizeable component B) comprises methacrylic functionality, acid or esterified.

To initiate polymerization of the monomers upon exposure to actinic radiation, the photoimageable composition contains a photoinitiator chemical system. In accordance with the invention, the photoinitiator chemical system comprises between about 0.005 and about 3 wt % of triphenylphosphene (TPPN) and between about 0.005 and about 2 wt % of n-phenylglycine (NPG) base on total weight of A) plus B). Neither TPPN nor NPG were found to be useful without the other in a photoimageable composition of the type to which the present invention is directed and in accordance with present day standards for such systems. However, the combination of TPPN and NPG in the amounts set forth herein produced excellent photospeed while avoiding the defects of either material alone. Thus, higher photospeeds were achieved without negative impact on adhesion, tenting strength or stability.

In addition to TPPN and NPG, other photoinitiator chemicals may be and typically are included as part of the photoinitiator chemical system. Generally, the photoinitiator chemical system comprises between about 0.1 and about 20 wt % based on total weight of A) plus B). Other photoinitiator chemicals include, but are not limited to 9-phenylacridine, aromatic ketones (benzophenone, N,N'-tetramethyl-4,4'-diaminobenzophenone [Michler's ketone], N,N'-tetraethyl-4,4'-diaminobenzophenone,4-methoxy-4'-dimethylaminobenzophenone, 3,3'-dimethyl-4-methoxybenzophenone, p,p'-bis(dimethylamino) benzophenone, p,p'-bis(diethylamino)-benzophenone, anthraquinone, 2-ethylanthraquinone, naphthaquinone, phenanthraquinone, benzoins (benzoin, benzoinmethylether, benzoinethylether, benzoinisopropylether, benzoin-n-butylether, benzoin-phenylether, methylbenzoin, ethybenzoin, etc.), benzyl derivatives (dibenzyl, benzyldiphenyldisulfide, benzyldimethylketal (SIC), etc.), acridine derivatives (9-phenylacridine, 1,7-bis(9-acridinyl) heptane, etc.), thioxanthones (2-chlorothioxanthone, 2-methylthioxanthone, 2,4-diethylthioxanthone, 2,4-dimethylthioxanthone, 2-isopropylthioxanthone, etc.), acetophenones (1,1dichloroacetophenone, p-t-butyldichloroacetophenone, 2,2-diethoxyacetophenone, 2,2-dimethoxy-2-phenylacetophenone, 2,2-dichloro-4-phenoxyacetophenone, etc.), etc..

It is preferred, though not required, that the photoinitiator chemical system of the present invention include a lophine dimer (imidazole dimer) at between about 0.5 and about 6 wt % based on total weight of A) plus B). Examples of such lophine dimers include, but are not limited to triphenylbiimidazoles, especially 2,4,5-triphenylimidazole dimers such as 2,2'-bis (o-chlorophenyl)-4,4',5,5'-tetraphenylbiimidazole, 2,2'-bis(o-chlorophenyl)-4,4',5,5'-tetrakis(m-methoxyphenyl) biimidazole, 2,2'-bis(p-carboxyphenyl)-4,4',5,5'-tetraphenylbiimidazole, 2,2'bis(p-chlorophenyl)-4,4',5,5'tetrakis(p-methoxyphenyl)-biimidazole, 2,2'-di-o-tolyl-4,4',5,5'tetraphenylbiimidazole, 2,2'-di-p-tolyl-4,4'-di-o-tolyl-5,5'-diphenylbiimidazole, etc..; these can be used individually or two or more can be used in combination.

The photoimageable composition may advantageously include one or more plasticizers at between about 0.5 and about 10 wt % based on total weight of A) plus B). Examples of suitable plasticizers include, but are not limited to, phthalate esters (e.g., dibutylphthalate, diheptylphthalate, dioctylphthalate, diallylphthalate), glycols (e.g., polyethylene-glycol, polypropyleneglycol), glycol esters (e.g., triethylene-glycoldiacetate, tetraethylene-glycoldiacetate, dipropyleneglycol-dibenzoate), phosphate esters (tricresylphosphate, tripheynlphosphate), amides (p-toluenesulfoneamide, benzenesulfoneamide, N-n-butylacetoneamide), aliphatic dibasic acid esters (diisobutyl-adipate, dioctyladipate, dimethylsebacate, dioctylazelate, dibutylmalate, triethylcitrate, tributylcitrate, triethylacetylcitrate, tri-n-propylacetylcitrate, tri-n-butylacetylcitrate, butyl-laurate, dioctyl-4,5-diepoxycyclohexane-1,2-dicarboxylate, glycerinetriacetylesters.

As noted above, compositions of the present invention typically include a color former to provide contrast to the light-exposed photoimageable composition. The combination of TPPN and NPG avoid the loss of contrast exhibited when TPPN is used without NPG. Color formers are typically used at between about 0.1 and about 1.0 wt % relative to total weight of A) plus B). Examples of color formers include, but are not limited to, diphenylamine, dibenzylaniline, triphenylamine, diethylaniline, diphenyl-p-phenylenediamine, p-toluidine, 4,4'-biphenyldiamine, o-chloroaniline, etc., leuco cystral violet; leuco malachite green.

Additionally, the photoimageable compositions may contain a wide variety of additional components as are known in the art, including additional polymers, such as those which might be used to effect a final hardened cure of a solder mask, dyes, stabilizers, flexibilizing agents, fillers etc.

Processing of the photoimageable composition is in a conventional manner. In a typical procedure, a photoimageable composition layer, either formed from a liquid composition or transferred as a layer from a dry film, is applied to a copper surface of a copper-clad board. The photoimageable composition layer is exposed to actinic radiation through appropriate artwork. Exposure to actinic radiation polymerizes the monomer in the light-exposed areas, resulting in a cross-linked structure that is resistant to developer. Next, the composition is developed in dilute alkaline aqueous solution, such as a 1% sodium carbonate solution. The alkali solution causes salt formation with the carboxylic groups of the binder polymers, rendering them soluble and removable. After development, an etchant may be used to remove copper from those areas where the resist was removed, thereby forming a printed circuit. The remaining resist is then removed using an appropriate stripper.

The invention provides a fine line (less than 75 microns) resist sidewall which adheres well to copper surfaces.

The invention will now be described in greater detail by way of specific examples.

Comparative Examples 1 and 2 and Example 3

A base photoimageable composition was formulated as follows:

| Component | wt % | wt %* | Chemical function |
|---|---|---|---|
| Polymer** | 51.45 | 56.4 | Polymer backbone |
| Polypropoxy monomethacrylate | 12 | 13.1 | Polymerizeable monomer |
| Isocyanurate, polyethoxy, trimethacrylic oligomer | 15 | 16.4 | Polymerizeable oligomer |
| Bis A, polyethoxy dimethacrylate | 13 | 14.2 | Polymerizeable monomer |
| Imidazole Dimer | 3.5 | 3.8 | Photoinitiator |
| 9-phenylacrydine | 0.1 | 0.11 | Photoinitiator |
| Leuco Cyrstal Violet | 0.4 | 0.44 | Color Former |
| Malachite Green Dye | 0.05 | 0.055 | Background Dye |
| Paratoluene Sulfonamide | 4.5 | 4.9 | Plasticizer |

*normalized based on polymer and polymerized monomers and oligomers totaling 100 wt %.
**23 wt % methacrylic acid, 66 wt % methylmethacrylate, 11 wt % butyl acrylate.

To the base formula was added NPG (Comparative Example 1), TPPN (Comparative Example 2) and a combination of NPG and TPPN (Example 3). Test conditions are set forth in the table below:

| Performance Criteria | Ex. 1 .05%* n-phenyl-glycine (NPG) | Ex. 2 0.30% triphenyl-phosphine (TPPN) | Ex. 3 Mixture .01% NPG + 0.2% TPPN | Performance Goal |
|---|---|---|---|---|
| Exposure (Stouffer 21 Step at 40 mJ) | 9.0 | 8.5 | 8.0 | >8.0 |
| Color Contrast (after 15 min. at 40 mJ) | 25% | 25% | 30% | >30% |
| Photospeed Stability (Stouffer 41 Step Change after 5 days holding) | 0 to 1 | 4.5 to 5.0 | 0 to 1 | 0 to 1 |
| Fine Line Adhesion Effect (4 times developing) | 44 microns | 40 microns | 32 microns | <35 microns |
| Tenting Strength | 440 grams | 580 grams | 660 grams | >600 grams |

*wt percentages; for normalized weight percentages multiply by 1.094
Notes:
a) Stouffer 21 Step was recorded after exposure to a UV emitting source and developing in 1% sodium carbonate monohydrate at 30° C. for 40 seconds.
b) Color contrast was measured using a UV/VIS Spectrophotometer comparing the color before exposure and then 15 minutes after exposure. Since the film was phototropic (color forming), the percentages in the chart represent a growth in color.
c) The stability was measured by taking a resist lacquer and testing the film after one day holding of the lacquer and then after five days holding. The Stouffer 41 Step was recorded on the two different days. A stable system would show little or change after that period of holding.
d) Fine line adhesion was measured on an imaged pattern utilizing line groupings a diminishing size (from 200 to 20 microns) with a fixed spacing between the lines of 400 microns. After exposing of the photoresist using this pattern and developing the lines 100% more than recommended, the adhesion of smallest lines are stressed causing a loss in adhesion. After this processing, the lines are inspected and the smallest lines remaining are recorded.
e) The tenting strength is a measure of the flexibility of the resist after exposure and development. In this test, the photoresist is laminated on both sides of a 6 millimeter hold and then exposed to 40 millijoules and developed in 1% sodium carbonate monohydrate at 30° C. A probe is then pressed into the tented hole and the grams of force at the point of rupturing the tent is recorded. A higher number would reflect a higher degree of flexibility.

What is claimed is:

1. A negative-acting photoimageable composition comprising
   A) between about 30 and about 80 wt % based on total weight of A) plus B) of a binder polymer having acid functionality sufficient to render said photoimageable composition developable in alkaline aqueous solution,
   B) between about 20 and about 70 wt % based on total weight of A) plus B) of an addition-polymerizable, non-gaseous α, β-ethylenically unsaturated compound (s) capable of forming a high polymer by free-radical initiated chain-propagating addition polymerization, at least about 50 mole percent of the α,β-ethylenically unsaturated moieties of B) being methacrylic moieties, and
   C) between about 0.1 and about 20 wt % based on total weight of A) plus B) of a photoinitiator chemical system, said photoinitiator chemical system comprising between about 0.005 and about 3 wt % relative to total weight of A) plus B) of triphenyphosphine and between about 0.005 and about 2 wt % relative to total weight of A) plus B) of n-phenylglycine.

2. The composition according to claim 1 further comprising between about 0.1 and about 1.0 wt % of a color former based on total weight of A) plus B).

3. The composition according to claim 1 further comprising between about 0.5 and about 6 wt % of an imidazole dimer based on total weight of A) plus B).

* * * * *